(12) United States Patent
Hikino et al.

(10) Patent No.: US 9,736,944 B2
(45) Date of Patent: Aug. 15, 2017

(54) STRUCTURE, WIRELESS COMMUNICATION DEVICE AND METHOD FOR MANUFACTURING STRUCTURE

(71) Applicant: Sharp Kabushiki Kaisha, Osaka-shi, Osaka (JP)

(72) Inventors: Nozomu Hikino, Osaka (JP); Hiroyuki Takebe, Osaka (JP)

(73) Assignee: Sharp Kabushiki Kaisha, Sakai (JP)

( * ) Notice: Subject to any disclaimer, the term of this patent is extended or adjusted under 35 U.S.C. 154(b) by 199 days.

(21) Appl. No.: 14/771,512

(22) PCT Filed: Jan. 31, 2014

(86) PCT No.: PCT/JP2014/052212
§ 371 (c)(1),
(2) Date: Aug. 31, 2015

(87) PCT Pub. No.: WO2014/148121
PCT Pub. Date: Sep. 25, 2014

(65) Prior Publication Data
US 2016/0029492 A1    Jan. 28, 2016

(30) Foreign Application Priority Data
Mar. 22, 2013  (JP) ................. 2013-061034

(51) Int. Cl.
*H05K 1/00* (2006.01)
*H05K 3/00* (2006.01)
(Continued)

(52) U.S. Cl.
CPC ........... *H05K 3/0014* (2013.01); *B29C 45/14* (2013.01); *B29C 45/16* (2013.01);
(Continued)

(58) Field of Classification Search
CPC .... B29C 2045/0079; B29C 2045/1687; B29C 45/14; B29C 45/16; B29C 45/1671;
(Continued)

(56) References Cited

U.S. PATENT DOCUMENTS 3,406,043 A    10/1968  Balde
8,289,216 B2 *  10/2012  Cho ................. B29C 45/1671
                                                    343/702

(Continued)

FOREIGN PATENT DOCUMENTS

CN    102170040 A    8/2011
CN    102740624 A   10/2012
(Continued)

OTHER PUBLICATIONS

Official Communication issued in International Patent Application No. PCT/JP2014/052212, mailed on Apr. 28, 2014.

*Primary Examiner* — Yuriy Semenenko
(74) *Attorney, Agent, or Firm* — Keating & Bennett, LLP

(57) ABSTRACT

A first resin layer (1) has: a covered region which is covered by a second resin layer (2) and an exposed region (1a); a contact part (1b) which is provided in the exposed region (1a); and a bend part (1c) which is provided between (a) a boundary between the covered region and the exposed region (1a) and (b) the contact part (1b).

14 Claims, 7 Drawing Sheets

(51) Int. Cl.

| | | |
|---|---|---|
| *H01Q 1/24* | (2006.01) | |
| *H05K 1/11* | (2006.01) | |
| *H05K 3/36* | (2006.01) | |
| *B29C 45/14* | (2006.01) | |
| *B29C 45/16* | (2006.01) | |
| *H04M 1/02* | (2006.01) | |
| *H05K 1/03* | (2006.01) | |
| *H05K 1/02* | (2006.01) | |
| *B29K 55/02* | (2006.01) | |
| *B29K 69/00* | (2006.01) | |
| *B29L 9/00* | (2006.01) | |
| *B29L 31/34* | (2006.01) | |
| *B29C 45/00* | (2006.01) | |
| *H05K 1/16* | (2006.01) | |

(52) U.S. Cl.
CPC ......... *B29C 45/1671* (2013.01); *H01Q 1/243* (2013.01); *H04M 1/0202* (2013.01); *H04M 1/0249* (2013.01); *H05K 1/0284* (2013.01); *H05K 1/032* (2013.01); *H05K 1/119* (2013.01); *H05K 3/36* (2013.01); *B29C 2045/0079* (2013.01); *B29C 2045/1687* (2013.01); *B29K 2055/02* (2013.01); *B29K 2069/00* (2013.01); *B29L 2009/00* (2013.01); *B29L 2031/3456* (2013.01); *B29L 2031/3481* (2013.01); *H05K 1/165* (2013.01); *H05K 2201/09018* (2013.01); *H05K 2201/09045* (2013.01); *H05K 2201/0999* (2013.01); *H05K 2201/09118* (2013.01); *H05K 2201/09472* (2013.01); *H05K 2201/09827* (2013.01); *H05K 2201/09845* (2013.01); *H05K 2201/10098* (2013.01); *H05K 2201/10265* (2013.01); *H05K 2201/2036* (2013.01); *H05K 2203/1322* (2013.01); *H05K 2203/1476* (2013.01)

(58) Field of Classification Search
CPC ............ B29K 2055/02; B29K 2069/00; B29L 2009/00; B29L 2031/3456; B29L 2031/3481; H01Q 1/243; H04M 1/0202; H04M 1/0249
See application file for complete search history.

(56) References Cited

U.S. PATENT DOCUMENTS

| | | | |
|---|---|---|---|
| 8,982,009 B2* | 3/2015 | Sung | H01Q 1/243 343/702 |
| 2011/0032153 A1* | 2/2011 | Hong | B29C 45/1671 343/700 MS |
| 2011/0205141 A1 | 8/2011 | Hong et al. | |
| 2011/0316759 A1* | 12/2011 | Fan | H01Q 1/42 343/873 |
| 2012/0200974 A1 | 8/2012 | Mikami et al. | |
| 2013/0084405 A1* | 4/2013 | Lee | H05K 3/184 427/555 |
| 2013/0126465 A1* | 5/2013 | Hu | C23C 28/021 216/13 |
| 2013/0176179 A1* | 7/2013 | Park | H01Q 1/243 343/702 |
| 2015/0249284 A1* | 9/2015 | Iriyama | H01Q 1/243 343/702 |
| 2015/0257270 A1* | 9/2015 | Kondo | H05K 1/11 343/700 MS |

FOREIGN PATENT DOCUMENTS

| | | |
|---|---|---|
| JP | 44-17862 B1 | 8/1969 |
| JP | 55-103979 U | 7/1980 |
| JP | 03-110746 U | 11/1991 |
| JP | 2002-009410 A | 1/2002 |
| JP | 2012-164758 A | 8/2012 |

* cited by examiner

# STRUCTURE, WIRELESS COMMUNICATION DEVICE AND METHOD FOR MANUFACTURING STRUCTURE

TECHNICAL FIELD

The present invention relates to (i) a structure including an electrically conductive pattern, (ii) a wireless communication apparatus including the structure, and (iii) a method for producing the structure.

BACKGROUND ART

In order to make an electronic device thinner and cause the electronic device to have a simpler structure, there has recently been developed a technique for integrally molding an electrically conductive pattern with a housing (Patent Literature 1).

Patent Literature 1 discloses a housing including a first injection layer, a second injection layer stacked on the first injection layer, an antenna radiator stacked on the second injection layer, and an outer layer stacked on the antenna radiator.

According to the technique disclosed in Patent Literature 1, the second injection layer is formed on a part of the first injection layer, the antenna radiator is formed on the second injection layer, and thereafter the outer layer is formed so as to cover an exposed part of the first injection layer and the antenna radiator.

Further, the first injection layer is provided with an electrically conductive connecting section, insert-molded therein, for sending and receiving signals with the antenna radiator.

CITATION LIST

Patent Literature

[Patent Literature 1]
Specification of U.S. Patent Application Publication No. 2011/0316759 (Publication Date: Dec. 29, 2011)

SUMMARY OF INVENTION

Technical Problem

According to the technique disclosed in Patent Literature 1, a resin that outflows into a space between the antenna radiator and the electrically conductive connecting section during formation of any of the layers may cover an electrically conductive surface and consequently cause a poor electrical connection between the antenna radiator and the electrically conductive connecting section.

The present invention has been made in view of the problem, and a main object of the present invention is to provide a structure including: a first resin layer; a second resin layer; and an electrically conductive pattern provided on a surface of the first resin layer, the second resin layer being molded on the first layer so that the electrically conductive pattern is provided between the first resin layer and the second resin layer, the structure being capable of preventing a poor electrical connection at a contact for electrically connecting the electrically conductive pattern to another member.

Solution to Problem

In order to attain the object, a structure in accordance with an aspect of the present invention includes: a first resin layer; a second resin layer; and an electrically conductive pattern provided on a surface of the first resin layer, the second resin layer being molded on the first layer so that the electrically conductive pattern is provided between the first resin layer and the second resin layer, and the first resin layer having: a covered region which is covered by the second resin layer and an exposed region which is not covered by the second resin layer; a contact part which is provided in the exposed region and in which a contact for electrically connecting the electrically conductive pattern to another member is provided; and a bend part which is provided between (a) a boundary between the covered region and the exposed region and (b) the contact part and which is a part bending on a surface of the first resin layer.

Advantageous Effects of Invention

According to an aspect of the present invention, a bend part is provided between (a) a boundary between a covered region and an exposed region and (b) a contact part. Thus, during formation of a second resin layer, a resin outflowing from the boundary to the contact part can be blocked, and a burr can be prevented from being formed on the contact part. This makes it possible to suitably prevent a poor electrical connection at a contact for electrically connecting an electrically conductive pattern to another member.

Figure 5:
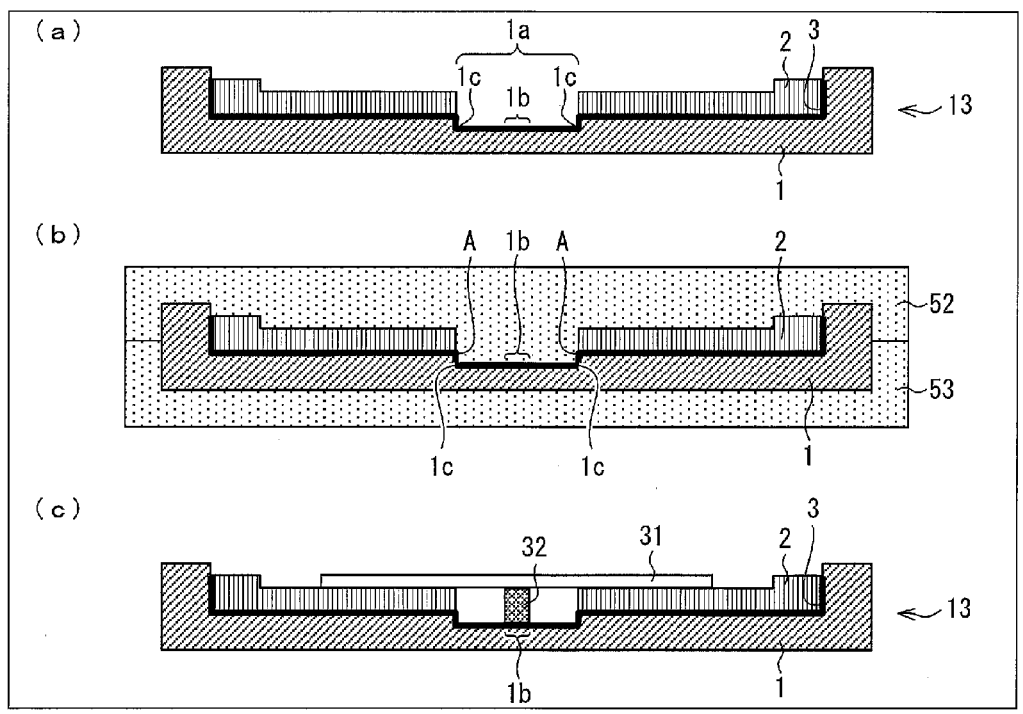

(a) of FIG. 5 is a side cross-sectional view schematically illustrating a configuration of a structure in accordance with an embodiment (Embodiment 2) of the present invention. (b) of FIG. 5 is a side cross-sectional view schematically illustrating a step of a method for producing the structure in accordance with the embodiment (Embodiment 2) of the present invention. (c) of FIG. 5 is a side cross-sectional view schematically illustrating a configuration in which the structure in accordance with the embodiment (Embodiment 2) of the present invention is incorporated in a wireless communication apparatus.

Figure 6:
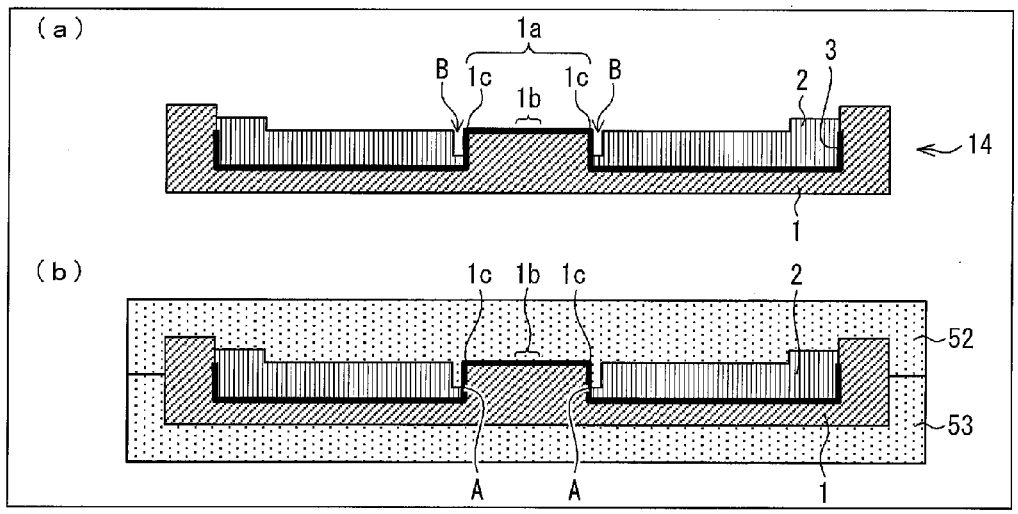

(a) of FIG. 6 is a side cross-sectional view schematically illustrating a configuration of a structure in accordance with an embodiment (Embodiment 3) of the present invention. (b) of FIG. 6 is a side cross-sectional view schematically illustrating a step of a method for producing a structure in accordance with Embodiment 3 of the present invention.

Figure 7:
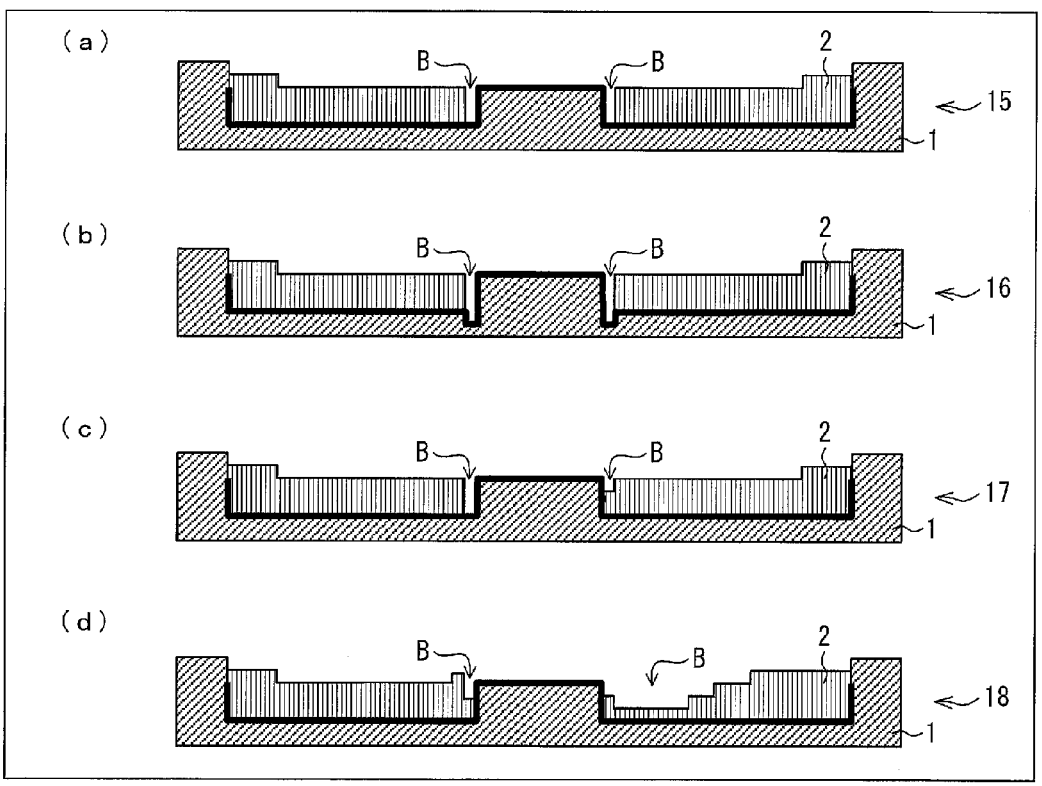

FIG. 7 is a side cross-sectional view illustrating variations of a shape of a structure in accordance with an embodiment (Embodiment 3) of the present invention.

Figure 8:
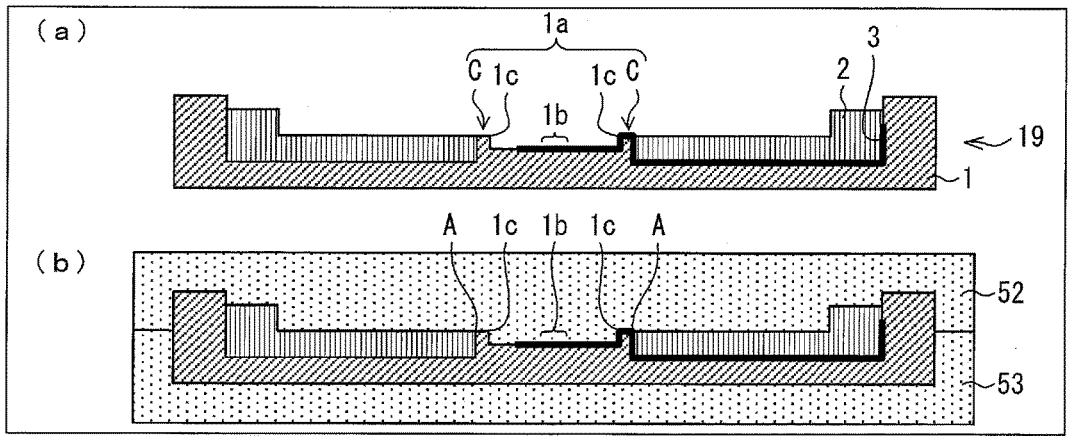

(a) of FIG. 8 is a side cross-sectional view schematically illustrating a configuration of a structure in accordance with an embodiment (Embodiment 4) of the present invention. (b) of FIG. 8 is a side cross-sectional view schematically illustrating a step of a method for producing the structure in accordance with the embodiment (Embodiment 4) of the present invention.

Figure 9:
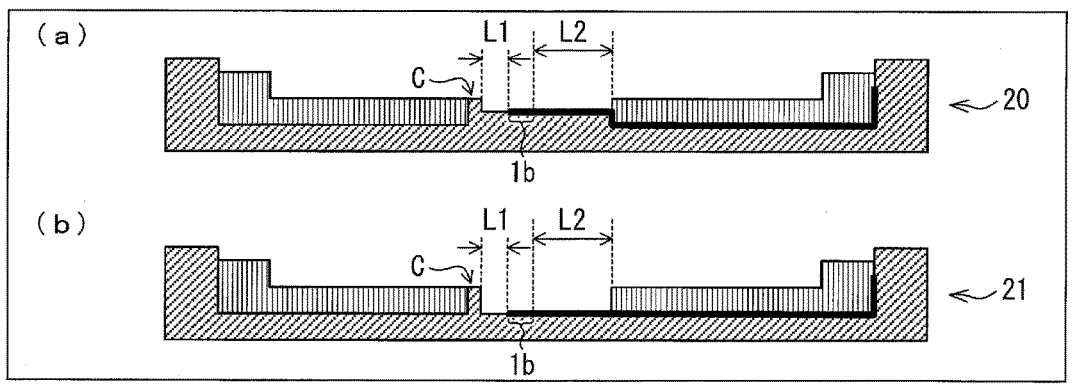

FIG. 9 is a side cross-sectional view illustrating variations of a shape of the structure in accordance with the embodiment (Embodiment 4) of the present invention.

Figure 10:
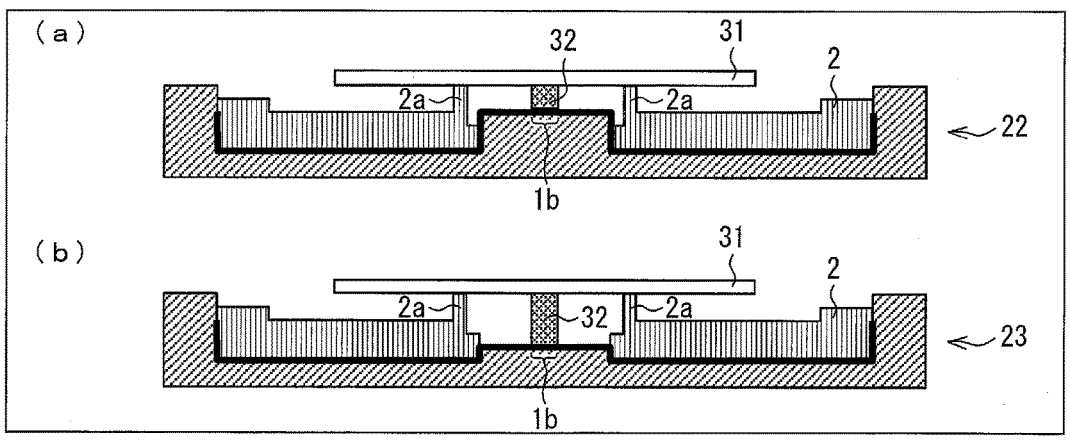

FIG. 10 is a side cross-sectional view schematically illustrating a configuration in which a structure in accordance with an embodiment (Embodiment 5) of the present invention is incorporated in a wireless communication apparatus.

Figure 11:
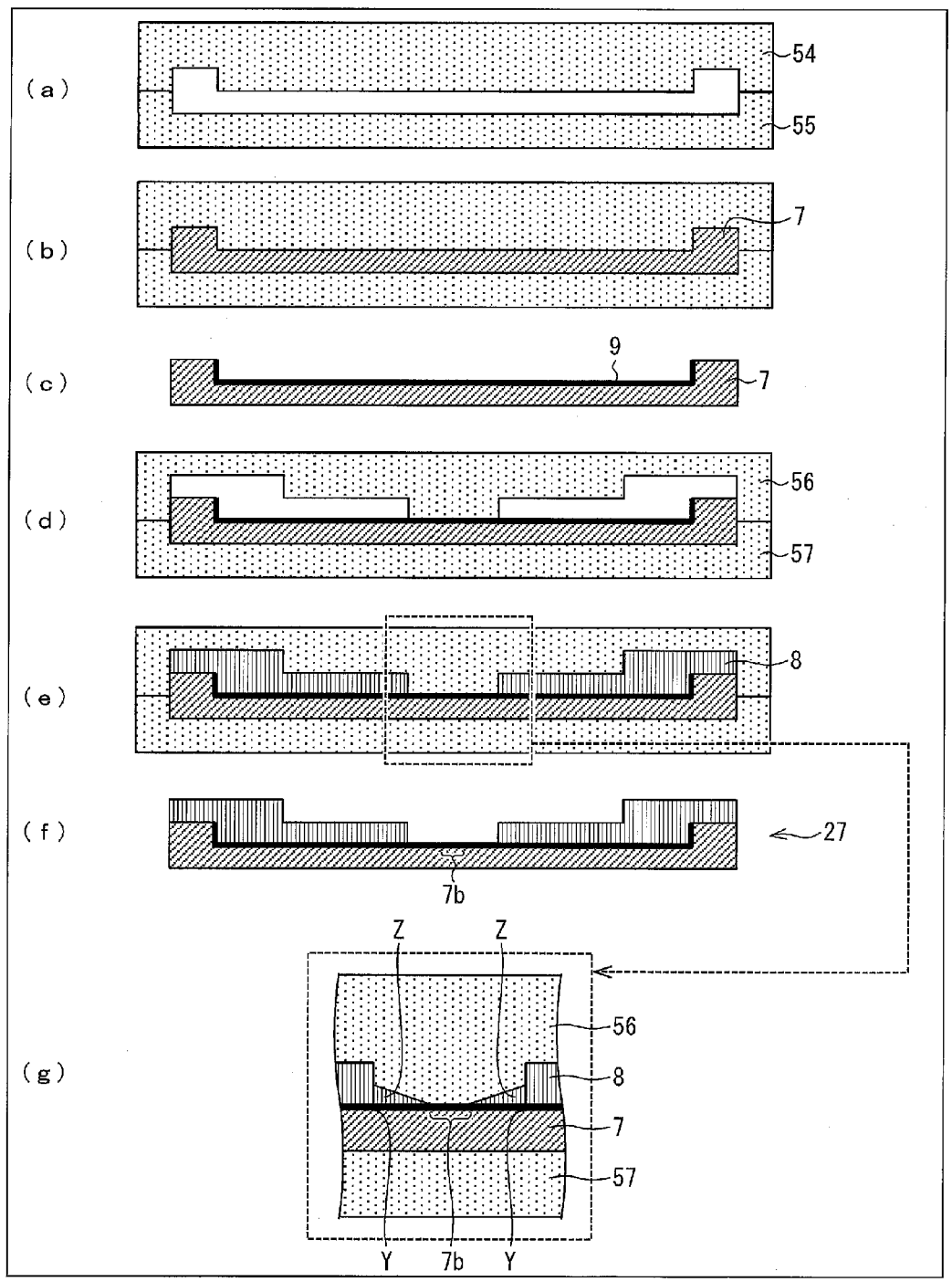

FIG. 11 is a side cross-sectional view schematically illustrating steps of a method for producing a structure in accordance with a reference technique.

Figure 12:
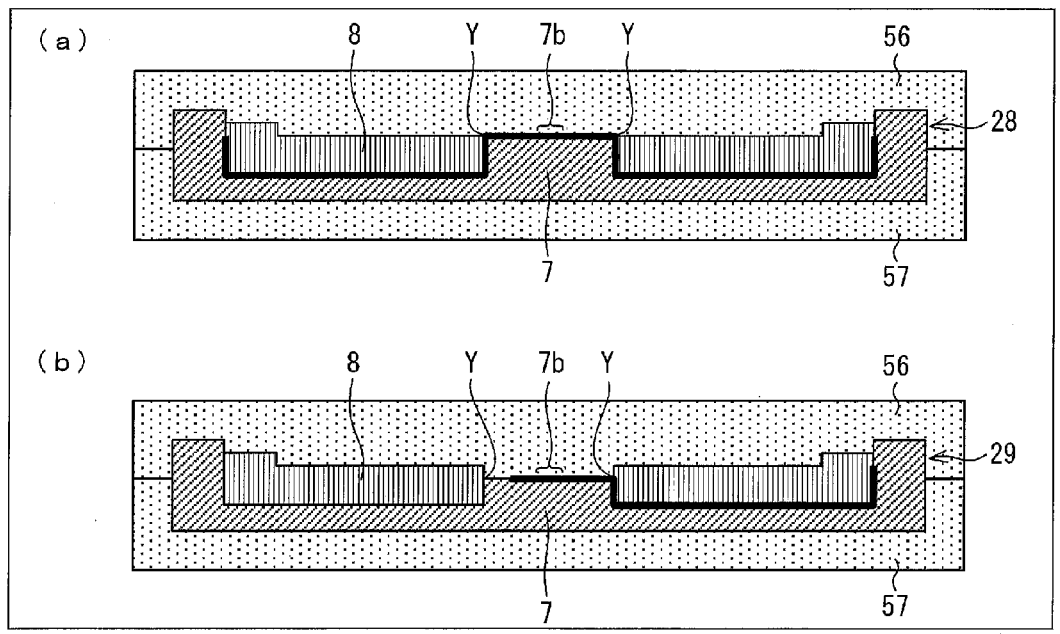

FIG. 12 is a side cross-sectional view illustrating variations of a shape of a structure in accordance with a reference technique.

Figure 13:
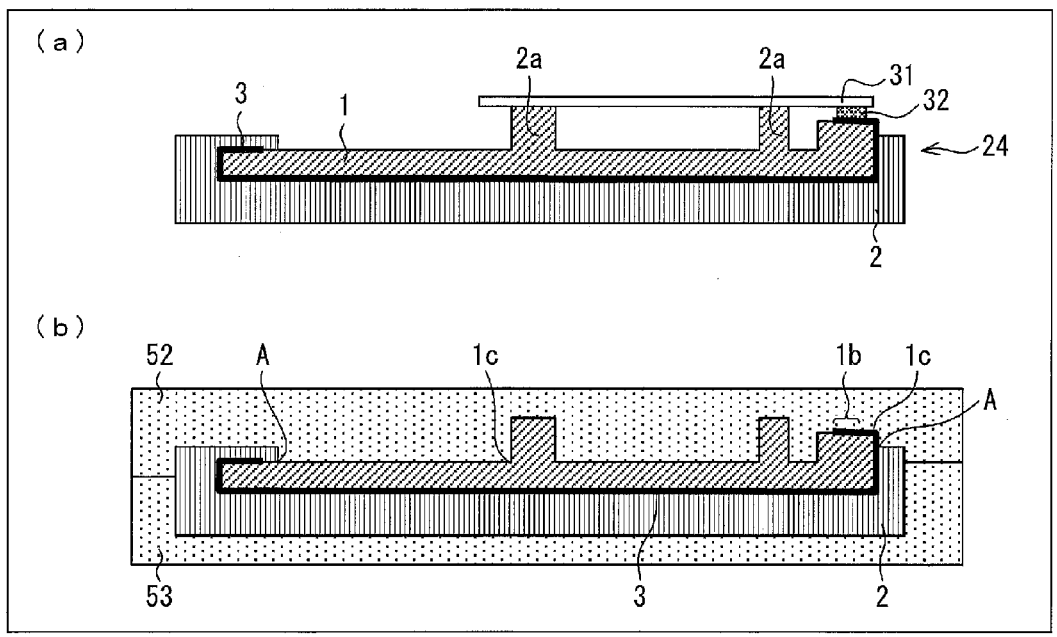

(a) of FIG. 13 is a side cross-sectional view schematically illustrating a configuration of a structure in accordance with a modification of the present invention. (b) of FIG. 13 is a side cross-sectional view schematically illustrating a step of a method for producing the structure in accordance with the modification.

DESCRIPTION OF EMBODIMENTS (Brief Description of Structure)

A structure in accordance with the present invention provides a general electronic device with an electrically conductive pattern by being incorporated in the general electronic device that requires the electrically conductive pattern serving as, for example, an antenna element, a signal transmission path, or an electric power transmission path. For example, according to an embodiment of the present invention, the structure in accordance with the present invention is incorporated in a wireless communication apparatus so as to provide an antenna element to be provided in the wireless communication apparatus. Alternatively, the structure in accordance with the present invention can be incorporated in an electronic device so as to provide, for example, a signal transmission path or an electric power transmission path that electrically connects a circuit board and another electronic component, or to provide a path that connects a circuit board and a ground.

Note that the structure in accordance with the present invention can be fixed to or detachably mounted in an electronic device. Note also that according to an embodiment of the present invention, the structure in accordance with the present invention can constitute at least part of a housing of an electronic device. In other words, the structure in accordance with the present invention can be an electrically conductive pattern-formed housing. Note that a housing refers to a member storing an electronic component of an electronic device and that an electrically conductive pattern-formed housing refers to a housing in which an electrically conductive pattern is provided. Note, however, that the structure in accordance with the present invention, which structure is not limited to such a structure as described above, can be a member different from a housing of an electronic device.

According to the structure in accordance with the present invention, it is possible to prevent exposure, to an outside of the structure, of the electrically conductive pattern, which is provided between the first resin layer and the second resin layer. This makes it possible to maintain a fine appearance of the structure, and to prevent, for example, breakage, deformation, or deterioration in the electrically conductive pattern.

The first resin layer and the second resin layer are both injection-molded articles. The first resin layer and the second resin layer can be made of a single resin or different resins. A usable resin(s) of which the first resin layer and the second resin layer is made is exemplified by, but not limited to one or more kinds of resins selected from, for example, acrylonitrile-butadiene-styrene resin (ABS), polycarbonate-acrylonitrile-butadiene-styrene resin (PC-ABS), polycarbonate (PC), acrylonitrile-styrene resin (AS), polyethylene (PE), polypropylene (PP), polystyrene (PS), and polymethyl methacrylate resin (PMMA). Note that it is possible to mix such a resin as described above and another material such as glass so as to cause the first resin layer and the second resin layer to have a higher strength.

Further, in an aspect of the present invention, it is possible to use, as a resin of which the first resin layer is made, a resin that is more resistant to heat than a resin of which the second resin layer is made. This can prevent the resins of which the first resin layer and the second resin layer are made from excessively melting together during formation of the second resin layer. For example, PC can be used as the resin of which the first resin layer is made, and ABS can be used as the resin of which the second resin layer is made.

The electrically conductive pattern is a pattern made of an electrically conductive material provided on a surface of the first resin layer. The electrically conductive material is not particularly limited in kind provided that the electrically conductive material is electrically conductive. Examples of a usable electrically conductive material include: metals such as copper, iron, nickel, and gold; an electrically conductive polymer; and electrically conductive carbon. A method for forming the electrically conductive pattern is not particularly limited. The electrically conductive pattern can be formed by, for example, plating the first resin layer with metal, printing, on the surface of the first resin layer, electrically conductive paste containing the electrically conductive material, or pasting, on the surface of the first resin layer, a filmy electrically conductive material having flexibility such as copper foil. The electrically conductive material for use in formation of the electrically conductive pattern is not limited to one kind of electrically conductive material. The electrically conductive pattern can be formed by combining a plurality of electrically conductive materials, e.g., by plating a copper pattern with gold.

For example, according to an embodiment of the present invention, the electrically conductive pattern can be formed by a Laser Direct Structuring (LDS) method. That is, an organic metal is mixed with a resin of which the first resin layer is made, and a region of the surface of the first resin layer in which region the electrically conductive pattern is to be formed is irradiated with a laser. This makes it possible to suitably form the electrically conductive pattern by precipitating the organic metal to the region irradiated with a laser, making the region irradiated with a laser finely rough (uneven), and combining the organic metal and the region irradiated with a laser. According to another embodiment of the present invention, the electrically conductive pattern can be formed by a Direct Printed Antenna (DPA) method. The DPA method is a method in which a printing plate for forming the electrically conductive pattern is prepared in advance and a shape of the electrically conductive pattern is transferred from the printing plate to a resin surface by use of, for example, a pad.

According to the methods described earlier (especially the LDS method), since the electrically conductive pattern is formed on the surface of the first resin layer by laser irradiation, the first resin layer and the electrically conductive pattern considerably more closely adhere to each other.

The first resin layer has a covered region which is covered by the second resin layer and an exposed region which is not covered by the second resin layer. The electrically conductive pattern and another member are electrically connected to each other in the exposed region. Note that a part of the first resin layer in which part a contact for electrically connecting the electrically conductive pattern to another member is provided is referred to as a contact part. The contact part can be provided at any place in the exposed region. A member to be electrically connected to the electrically conductive pattern at the contact can be but is not limited to, for example, an electrically conductive connecting member such as an electrically conductive spring member.

For example, the structure in accordance with the present invention can be produced as below. First, the first resin layer is formed in a desired shape by use of a publicly-known injection molding technique (a first resin layer forming step). Next, the electrically conductive pattern is formed on the surface of the first resin layer by use of the method described earlier (an electrically conductive pattern forming step).

Thereafter, the second resin layer is stacked on the first resin layer so that the electrically conductive pattern is provided between the first resin layer and the second resin layer (a stacking step). In the stacking step, the second resin layer is integrally molded, by insert-molding, with the first resin layer, which has already been formed. That is, by molding (insert-molding) the second resin layer while the first resin layer is provided in a mold, the first resin layer and the second resin layer can closely adhere (are attached) to each other favorably in a region in which the electrically conductive pattern is absent.

In this case, a resin of which the second resin layer is made may outflow from the covered region to the exposed region via a gap between the first resin layer and the mold during the molding of the second resin layer. Note here that a poor electrical connection may occur at the contact in a case where a burr is formed on the contact part in the exposed region by the resin having flowed into the exposed region.

However, the structure in accordance with the present invention is configured such that a bend part is provided between (a) a boundary between the covered region and the exposed region and (b) the contact part. With the configuration, the resin outflowing from the boundary to the contact part can be blocked, and a burr can be prevented from being formed on the contact part. This makes it possible to suitably prevent a poor electrical connection at the contact for electrically connecting the electrically conductive pattern to another member. This allows an improvement in reliability and yield.

Note that "bend" herein refers to discontinuous bending, and more preferably refers to bending at an angle of not less than 3° and not more than 90°, and particularly preferably of not less than 20° and not more than 90°.

Subsequently, several embodiments of the present invention are specifically described below with reference to the drawings. Note that in the following description of the embodiments, members having identical functions and operations are given respective identical reference numerals, and a description of those members is omitted.

[Embodiment 1]

Figure 1:
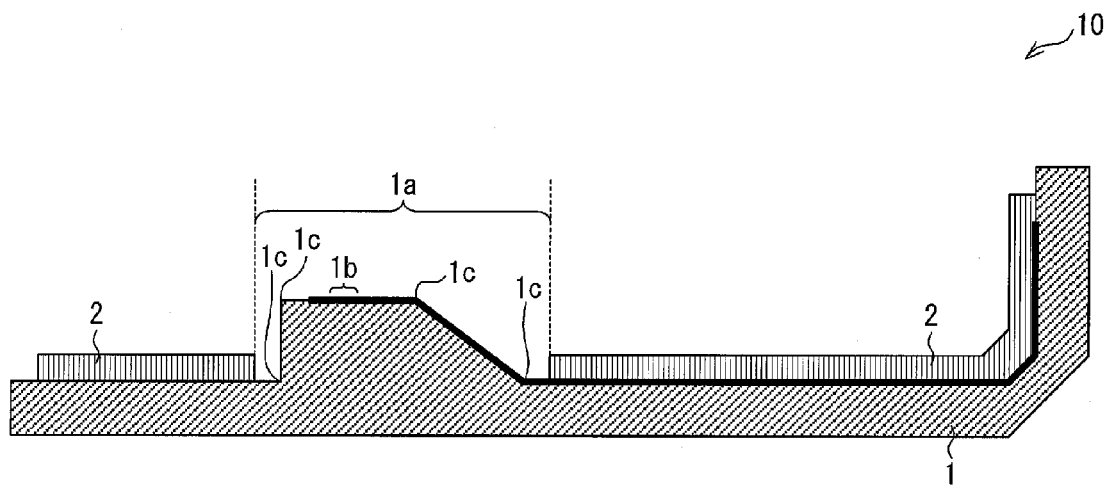
FIG. 1 is a side cross-sectional view schematically illustrating a configuration of a structure in accordance with an embodiment (Embodiment 1) of the present invention.

FIG. 1 is a side cross-sectional view schematically illustrating a configuration of a structure 10 in accordance with an embodiment (Embodiment 1) of the present invention. As illustrated in FIG. 1, the structure 10 includes a first resin layer 1, a second resin layer 2, and an electrically conductive pattern 3. The second resin layer 2 is molded on the first resin layer 1, on which the electrically conductive pattern 3 is provided, so that the electrically conductive pattern 3 is provided between the first resin layer 1 and the second resin layer 2.

The first resin layer 1 has a covered region which is covered by the second resin layer 2 and an exposed region 1a which is not covered by the second resin layer 2. The first resin layer 1 also has a contact part 1b which is provided in the exposed region 1a and in which a contact for electrically connecting the electrically conductive pattern 3 to another member is provided. Note that the structure 10 which is observed from the second resin layer 2 side (upper side in FIG. 1) is configured such that the second resin layer 2 entirely surrounds the exposed region 1a.

The first resin layer 1 also has a bend part 1c which is provided between (a) a boundary between the covered region and the exposed region 1a and (b) the contact part 1b and which is a part bending on a surface of the first resin layer 1. The exposed region 1a has a protrusion which protrudes with respect to the covered region, which is adjacent to the exposed region 1a. As illustrated in FIG. 1, the protrusion can have a side wall that is perpendicular or oblique to the first resin layer 1 around the protrusion.

Figure 2:
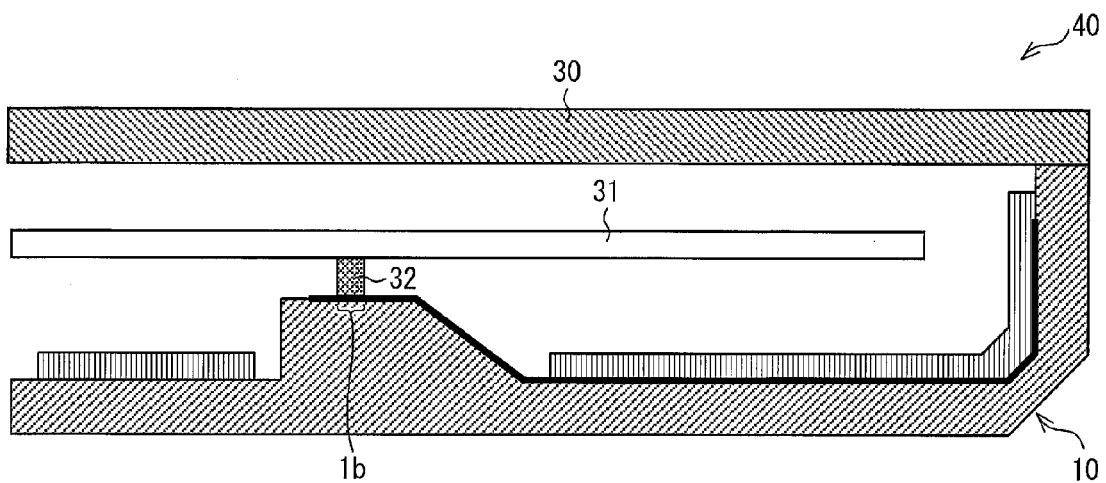
FIG. 2 is a side cross-sectional view schematically illustrating a configuration of a wireless communication apparatus in accordance with the embodiment (Embodiment 1) of the present invention.

As illustrated in FIG. 2, the structure 10 can be incorporated in a wireless communication apparatus 40. In this case, the structure 10, which, together with an upper housing 30, constitutes a housing (an electrically conductive pattern-formed housing) of the wireless communication apparatus 40, stores therein a circuit board 31 on which a wireless circuit, for example, is mounted. The circuit board 31 is electrically connected to the electrically conductive pattern of the structure 10 via a connecting member 32 at the contact provided on the contact part 1b. The connecting member 32 is electrically connected to the circuit board 31. The connecting member 32 can be, for example, a spring member. The wireless communication apparatus 40 uses the electrically conductive pattern of the structure 10 as an antenna element.

That is, the wireless communication apparatus 40 includes a housing including the structure 10 and an antenna including the electrically conductive pattern. Note, however, that the structure in accordance with the present invention, which structure is not limited to such a structure as described above, can be incorporated in an electronic device different from a wireless communication apparatus.

Figure 3:
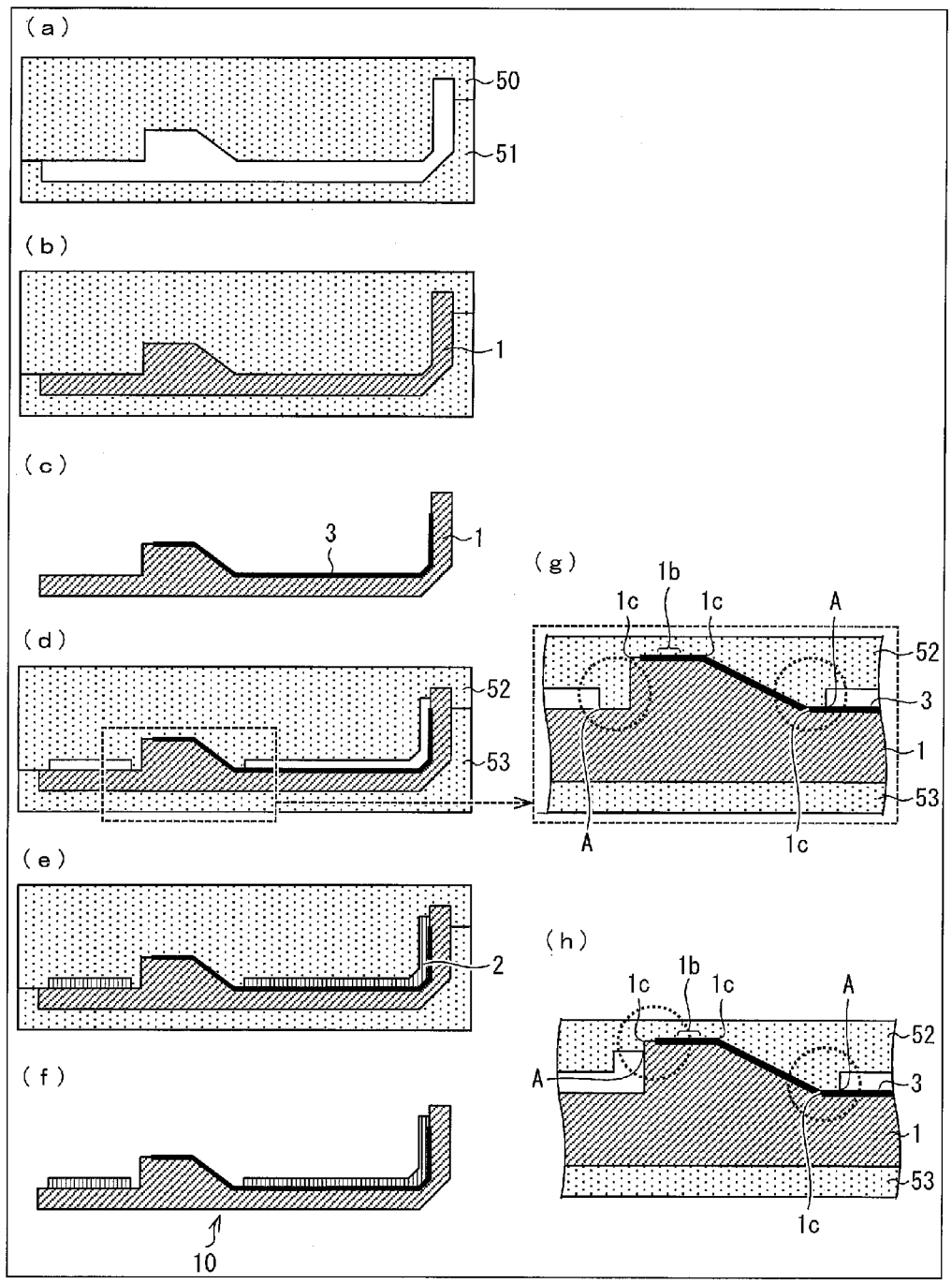
FIG. 3 is a side cross-sectional view schematically illustrating steps of a method for producing the structure in accordance with the embodiment (Embodiment 1) of the present invention.

FIG. 3 is a side cross-sectional view schematically illustrating steps of a method for producing the structure in accordance with Embodiment 1. According to Embodiment 1, the structure 10 is produced as below. A mold 50 and a mold 51 are used (see (a) of FIG. 3) to mold the first resin layer 1 (see (b) of FIG. 3). Thereafter, the electrically conductive pattern 3 is formed on the first resin layer 1 (see (c) of FIG. 3). Subsequently, the first resin layer 1, on which the electrically conductive pattern 3 has been formed, is placed so that a mold 52 is fitted to the protrusion of the exposed region (see (d) of FIG. 3), the second resin layer 2 is molded so as to be integrated with the first resin layer 1 (see (e) of FIG. 3), and the structure 10 is completed (see (f) of FIG. 3).

(Advantageous Effects of Embodiment 1)

First, the following description discusses, with reference to the drawings, a problem that occurs in a case where the bend part of the present invention is absent. FIG. 11 is a side cross-sectional view schematically illustrating steps of a method for producing a structure in accordance with a reference technique in which structure, unlike the present invention, the bend part $1c$ is absent. According to the reference technique, a structure 27 is produced as below. A mold 54 and a mold 55 are used (see (a) of FIG. 11) to mold a first resin layer 7 (see (b) of FIG. 11). Thereafter, an electrically conductive pattern 9 is formed on the first resin layer 7 (see (c) of FIG. 11). Subsequently, the first resin layer 7, on which the electrically conductive pattern 9 has been formed, is placed in a mold 56 and a mold 57 (see (d) of FIG. 11), a second resin layer 8 is molded so as to be integrated with the first resin layer 7 (see (e) of FIG. 11), and the structure 27 is completed (see (f) of FIG. 11).

Note here that during formation of the second resin layer 8 (see (e) of FIG. 11), a burr Z may be formed (see (g) of FIG. 11) in a case where a resin of which the second resin layer is made may outflow from a boundary Y between a covered region and an exposed region to the exposed region, the covered region being a region in which the second resin layer is formed, the exposed region being a region in which the second resin layer is formed. The burr Z that reaches a contact part $7b$ prevents an electrical connection between the electrical conductive pattern 9 and another member on the contact part $7b$.

Such an outflow of the resin from the boundary Y to the contact part $7b$ may occur in a structure illustrated in FIG. 12 as well as in the structure 27 illustrated in FIG. 11 and having a flat region in which the electrically conductive pattern 9 of the first resin layer 7 is provided. That is, the resin may outflow from the boundary Y to the contact part $7b$ also in a structure 28 illustrated in (a) of FIG. 12 and having the contact part $7b$ of the first resin layer 7 which contact part $7b$ is flush with the second resin layer 8. Further, the resin may outflow from the boundary Y to the contact part $7b$ also in a structure 29 illustrated in (b) of FIG. 12 and having the contact part $7b$ of the first resin layer 7 which contact part is located so as to be anterior to the second resin layer 8 in a direction from the second resin layer 8 toward the first resin layer 7.

In contrast, according to the structure 10 in accordance with Embodiment 1, the bend part $1c$ is provided between (a) the boundary between the covered region and the exposed region $1a$ and (b) the contact part $1b$. Thus, as illustrated in (g) of FIG. 3, during formation of the second resin layer 2, the resin outflowing from the boundary A to the contact part $1b$ can be successfully blocked at a place encircled by a broken line, so that a burr can be prevented from being formed on the contact part $1b$. According to Embodiment 1, in a case where a recess of the mold 52 is fitted to the protrusion, with which the exposed region $1a$ is provided, the contact part $1b$ is completely covered by the mold 52. This makes it possible to prevent the resin of which the second resin layer 2 is made from flowing into the contact part $1b$.

This makes it possible to suitably prevent the poor electrical connection at the contact for electrically connecting the electrically conductive pattern to another member. Further, since it is unnecessary to consider an outflow of the resin of which the second resin layer 2 is made, the contact part $1b$ can have a smaller structure. Furthermore, as illustrated in FIG. 2, the structure 10 that is incorporated in the wireless communication apparatus 40 can suitably prevent a poor electrical connection between the antenna including the electrically conductive pattern 3 and a wireless circuit (the circuit board 31) included in the wireless communication apparatus 40.

(Modification)

As illustrated on the left side of (h) of FIG. 3, in a case where the second resin layer 2 extends to a part of the side wall of the protrusion of the exposed region but the bend part $1c$ is provided between (i) a boundary A between the covered region and the exposed region and (ii) the contact part $1b$, the present modification can yield an effect equivalent to that yielded by Embodiment 1. Same applies to a structure 11 illustrated in (a) of FIG. 4 and including the second resin layer 2 that extends to both sides of the side wall of the exposed region $1a$.

Figure 4:
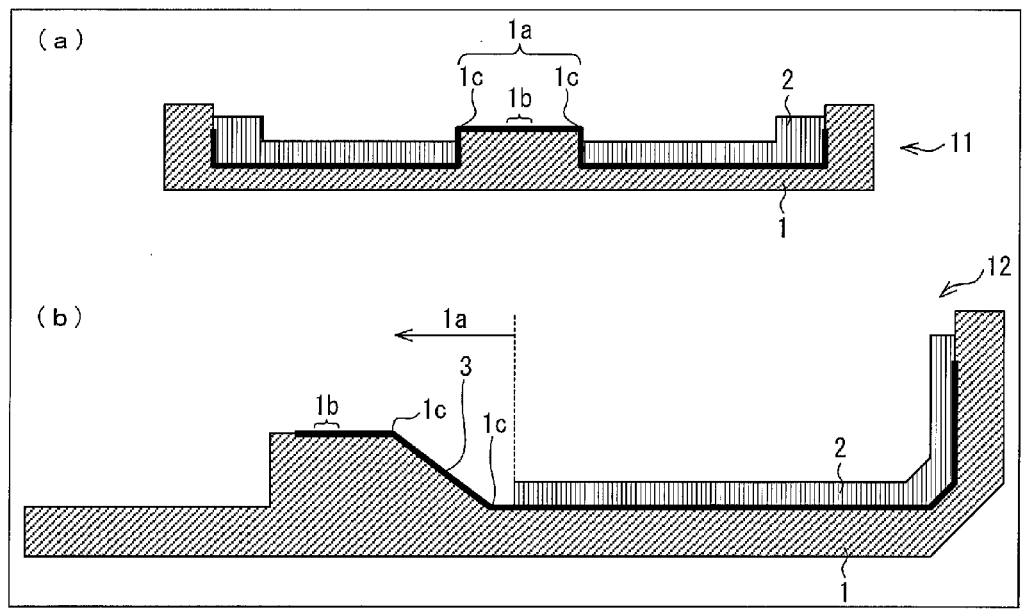
FIG. 4 is a side cross-sectional view illustrating variations of a shape of the structure in accordance with the embodiment (Embodiment 1) of the present invention.

Note that, as in a structure 12 illustrated in (b) of FIG. 4, the second resin layer 2 does not necessarily need to be provided so as to entirely surround the exposed region $1a$ when the structure 12 is observed from the second resin layer 2 side (upper side in FIG. 4). The second resin layer 2 only needs to be provided in at least a part of a surrounding area of the exposed region $1a$. The present invention has an object to prevent a burr from flowing into the contact part $1b$ in a case where the second resin layer 2 thus provided in at least the part of the surrounding area of the exposed region $1a$ is in proximity to the contact part $1b$.

[Embodiment 2]

(a) of FIG. 5 is a side cross-sectional view schematically illustrating a configuration of a structure 13 in accordance with an embodiment (Embodiment 2) of the present invention. As illustrated in (a) of FIG. 5, the structure 13 is configured such that an exposed region $1a$ has a recess which is recessed with respect to a covered region, which is adjacent to the exposed region $1a$. Even in a case where the structure 13 has such a structure as described above, a bend part $1c$ is provided between (a) a boundary A between the covered region and the exposed region $1a$ and (b) a contact part $1b$ as illustrated in (b) of FIG. 5. Thus, during formation of the second resin layer 2, the resin outflowing from the boundary A to the contact part $1b$ can be successfully blocked, so that a burr can be prevented from being formed on the contact part $1b$. Note that, according to Embodiment 2, in a case where a protrusion of the mold 52 is fitted to the recess, with which the exposed region $1a$ is provided, the contact part $1b$ is completely covered by the mold 52. This makes it possible to prevent the resin of which the second resin layer 2 is made from flowing into the contact part $1b$.

Note that the structure 13 which is observed from the second resin layer 2 side (upper side in FIG. 5) is configured such that the second resin layer 2 entirely surrounds the exposed region. However, Embodiment 2 is not limited in configuration to this. The structure 13 only needs to be configured such that the second resin layer 2 is provided in at least a part of a surrounding area of the exposed region $1a$.

According to an embodiment of the present invention, as illustrated in (c) of FIG. 5, the structure 13 that is incorporated in such a wireless communication apparatus as illustrated in FIG. 2 is preferably configured such that a spring member fixed to a circuit board 31 is used as a connecting member 32 and the circuit board 31 is brought into contact with the second resin layer 2. This makes it possible to (i) maintain a distance between the circuit board 31 and the structure 13, (ii) prevent the connecting member 32 from being deformed by being unnecessarily pressed, and (iii) favorably connect the circuit board 31 and an electrically conductive pattern 3.

[Embodiment 3]

(a) of FIG. 6 is a side cross-sectional view schematically illustrating a configuration of a structure 14 in accordance with an embodiment (Embodiment 3) of the present invention. According to the structure 14, a contact part 1b and a second resin layer 2 are flush with each other. In this case, a resin of which the second resin layer 2 is made may flow into a contact part 1b as in the case of the structure 28 illustrated in (a) of FIG. 12. However, according to the structure 14 in accordance with Embodiment 3, by providing a notch (groove) B around an exposed region 1a, a bend part 1c is provided between (a) a boundary A between a covered region and the exposed region 1a and (b) the contact part 1b as illustrated in (b) of FIG. 6. That is, in a case where the second resin layer 2 is provided with the notch B, a protrusion which protrudes with respect to the covered region, which is adjacent to the exposed region 1a, is formed in the exposed region 1a, so that the protrusion can be fitted to a recess of a mold 52. With this, even in a case where the contact part 1b needs to be located so as to be flush with the second resin layer 2, it is possible to prevent the resin of which the second resin layer 2 is made from flowing into the contact part 1b.

The structure 14 which is observed from the second resin layer 2 side (upper side in FIG. 6) is configured such that the second resin layer 2 entirely surrounds the exposed region 1a and the notch B is provided so as to entirely surround the exposed region 1a. However, Embodiment 3 is not limited to this. It is only necessary that the second resin layer 2 be provided in at least a part of a surrounding area of the exposed region 1a and that the notch B be provided at a boundary between the exposed region 1a and the second resin layer 2.

FIG. 7 has side cross-sectional views illustrating variations of a shape of a structure in accordance with Embodiment 3. As in a structure 15 illustrated in (a) of FIG. 7, the notch B can have a bottom surface that is an upper surface of a first resin layer 1. Alternatively, as in a structure 16 illustrated in (b) of FIG. 7, the notch B can have the bottom surface that is a recess provided in the first resin layer 1. As in a structure 17 illustrated in (c) of FIG. 7, the notch B can have a depth that varies depending on its location. As in a structure 18 illustrated in (d) of FIG. 7, the notch B can have a shape that is not particularly limited but only needs to allow the exposed region 1a and a mold to be fitted to each other.

[Embodiment 4]

(a) of FIG. 8 is a side cross-sectional view schematically illustrating a configuration of a structure 19 in accordance with an embodiment (Embodiment 4) of the present invention. According to the structure 19, a contact part 1b is located so as to be anterior to a second resin layer 2 in a direction from the second resin layer 2 toward a first resin layer 1 (in a lower part of FIG. 8). In this case, a resin of which the second resin layer 2 is made may flow into the contact part 1b as in the case of the structure 29 illustrated in (b) of FIG. 12. However, according to the structure 19 in accordance with Embodiment 4, by providing a protrusion C on an outer edge of an exposed region 1a, a bend part 1c is provided between (a) a boundary A between a covered region and the exposed region and (b) the contact part 1b as illustrated in (b) of FIG. 8. That is, a recess surrounded by the protrusion C is formed in the exposed region, so that the recess can be fitted to a protrusion of a mold 52. With this, even in a case where the contact part 1b needs to be located so as to be anterior to the second resin layer 2 in the direction from the second resin layer 2 toward the first resin layer 1, it is possible to prevent the resin of which the second resin layer 2 is made from flowing into the contact part 1b.

The structure 19 which is observed from the second resin layer 2 side (upper side in FIG. 8) is configured such that the protrusion C is provided so as to entirely surround the outer edge of the exposed region and the second resin layer 2 entirely surrounds the protrusion C. However, Embodiment 4 is not limited to this. It is only necessary that the protrusion C be provided in at least a part of the outer edge of the exposed region and that the second resin layer 2 be provided so as to be adjacent to the protrusion C.

FIG. 9 has side cross-sectional views illustrating variations of a shape of a structure in accordance with Embodiment 4. As in a structure 20 illustrated in (a) of FIG. 9, the structure in accordance with Embodiment 4 can be configured such that the protrusion C is provided in a part having a short distance (L1) between the contact part 1b and the second resin layer 2 but no protrusion C is provided in a part having a long distance (L2) between the contact part 1b and the second resin layer 2. That is, no protrusion C needs to be provided in a part in which no burr is formed on the contact part 1b due to a long distance between the contact part 1b and the second resin layer 2 even in a case where a resin of which the second resin layer is made outflows. Same applies to a structure 21 illustrated in (b) of FIG. 9.

[Embodiment 5]

(a) of FIG. 10 is a side cross-sectional view schematically illustrating a configuration of a structure 22 in accordance with an embodiment (Embodiment 5) of the present invention. As illustrated in (a) of FIG. 10, a second resin layer 2 can have a columnar part 2a which protrudes on a side opposite from a first resin layer 1 (in an upward direction in FIG. 10). The columnar part 2a is provided around a contact part 1b. In a case where the structure 22 which is incorporated in such a wireless communication apparatus as illustrated in FIG. 2 is configured such that the columnar part 2a is brought into contact with a circuit board 31 which is electrically connected to an electrically conductive pattern 3, it is possible (i) to support the circuit board 31 and (ii) to favorably connect the circuit board 31 and the electrically conductive pattern 3 while maintaining a distance between the circuit board 31 and the structure 22.

That is, in a case where, for example, (i) a circuit board is incorporated in a wireless communication apparatus below expectations and a contact of a connecting member (spring member) is positionally displaced while a structure is being incorporated in the wireless communication apparatus, (ii) a contact part is locally pushed in by a significantly strong force caused by, for example, a shock after the structure is incorporated in the wireless communication apparatus, or (iii) the circuit board bends toward the structure by being momentarily positionally displaced by, for example, a shock, a bad contact may be caused by the connecting member (e.g., a spring member) that is pushed into the contact part with a degree beyond an allowable range and is deformed by being pressed. In contrast, the structure 22 in accordance with Embodiment 5 makes it possible to prevent a connecting member 32 from being deformed by being unnecessarily pressed and to favorably connect the circuit board and the electrically conductive pattern. Same applies to a structure 23 illustrated in (b) of FIG. 10. Note that a part that protrudes from the second resin layer 2 can have not only a columnar shape but also, for example, a wall shape, provided that the part is configured so as to push up the circuit board 31.

<Modification>

Note that the second resin layer 2 can be provided so as to be closer to an outside of the structure than the first resin layer 1 (for example, closer to an outside of the structure that is incorporated in the wireless communication apparatus as illustrated in FIG. 2). In other words, the second resin layer 2 can be stacked on a first side of the first resin layer 1 which first side is opposite from a second side of the first resin layer 1 on which second side the contact part 1b is provided.

FIG. 13 shows a modification having such a configuration as described above. (a) of FIG. 13 is a side cross-sectional view schematically illustrating a configuration of a structure 24 in accordance with the modification. According to the structure 24, the columnar part 2a is provided on a first side of the first resin layer 1 on which first side the contact part 1b is provided, and the second resin layer 2 is stacked on a second side of the first resin layer 1 which second side is opposite from the first side on which the columnar part 2a is provided. As in the case of the structure 22 in accordance with Embodiment 5, by bringing the columnar part 2a and the circuit board 31 into contact with each other, the structure 24 makes it possible to prevent the connecting member 32 from being deformed by being unnecessarily pressed and to favorably connect the circuit board 31 and the electrically conductive pattern 3.

Further, as illustrated in (b) of FIG. 13, a bend part 1c is provided between (i) a boundary A between a covered region and an exposed region and (ii) the contact part 1b. Thus, a resin outflowing from the boundary A to the contact part 1b can be successfully blocked, so that a burr can be prevented from being formed on the contact part 1b. Further, a protrusion with which the exposed region is provided and a recess with which a mold 52 is provided can be successfully fitted to each other.

CONCLUSION

A structure in accordance with an aspect of the present invention includes: a first resin layer; a second resin layer; and an electrically conductive pattern provided on a surface of the first resin layer, the second resin layer being molded on the first layer so that the electrically conductive pattern is provided between the first resin layer and the second resin layer, and the first resin layer having: a covered region which is covered by the second resin layer and an exposed region which is not covered by the second resin layer; a contact part which is provided in the exposed region and in which a contact for electrically connecting the electrically conductive pattern to another member is provided; and a bend part which is provided between (a) a boundary between the covered region and the exposed region and (b) the contact part and which is a part bending on a surface of the first resin layer.

According to the configuration, the bend part is provided between (a) the boundary between the covered region and the exposed region and (b) the contact part. Thus, during formation of the second resin layer, a resin outflowing from the boundary to the contact part can be blocked, and a burr can be prevented from being formed on the contact part. This makes it possible to suitably prevent a poor electrical connection at the contact for electrically connecting the electrically conductive pattern to another member.

The structure in accordance with an aspect of the present invention can be configured such that the exposed region has a protrusion which protrudes with respect to the covered region, which is adjacent to the exposed region.

According to the configuration, in a case where the protrusion, with which the exposed region is provided, is fitted to a recess of a mold during formation of the second resin layer, it is possible to prevent the resin from flowing into the contact part in the exposed region.

The structure in accordance with an aspect of the present invention can be configured such that the exposed region has a recess which is recessed with respect to the covered region, which is adjacent to the exposed region.

According to the configuration, in a case where the recess, with which the exposed region is provided, is fitted to a protrusion of the mold during formation of the second resin layer, it is possible to prevent the resin from flowing into the contact part in the exposed region.

The structure in accordance with an aspect of the present invention can be configured such that the second resin layer has a columnar part which protrudes on a side opposite from the first resin layer.

According to the configuration, in a case where the columnar part is brought into contact with a circuit board which is electrically connected to the electrically conductive pattern, it is possible (i) to support the circuit board and (ii) to favorably connect the circuit board and the electrically conductive pattern while maintaining a distance between the circuit board and the structure.

A wireless communication apparatus in accordance with an aspect of the present invention includes: a housing in accordance with an aspect of the present invention; and an antenna including the electrically conductive pattern.

According to the configuration, it is possible to suitably prevent a poor electrical connection between the antenna including the electrically conductive pattern and a wireless circuit included in the wireless communication apparatus.

The wireless communication apparatus in accordance with an aspect of the present invention can be configured to further include: a circuit board; and a connecting member which is electrically connected to the circuit board and which is electrically connected to the electrically conductive pattern at the contact.

According to the configuration, it is possible to suitably connect the circuit board and the electrically conductive pattern.

The wireless communication apparatus in accordance with an aspect of the present invention can be configured such that: the connecting member is a spring member; and the circuit board is brought into contact with the second resin layer when the spring member is electrically connected to the electrically conductive pattern at the contact.

According to the configuration, by bringing a substrate into contact with the circuit board, it is possible to (i) maintain a distance between the circuit board and the structure, (ii) prevent the spring member from being deformed by being unnecessarily pressed, and (iii) favorably connect the circuit board and the electrically conductive pattern.

A method for producing the structure in accordance with an aspect of the present invention includes the step of: placing, in a mold, the first resin layer on which the electrically conductive pattern is provided, and integrally molding the second resin layer with the first resin layer in a state in which the mold and the exposed region are fitted to each other.

According to the configuration, in a case where the exposed region is fitted to the mold during formation of the second resin layer, it is possible to prevent the resin from flowing into the contact part in the exposed region.

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

The present invention is usable in the field of production of (i) a structure including an electrically conductive pattern and (ii) a wireless communication apparatus including the structure.

REFERENCE SIGNS LIST

1 First resin layer
1a Exposed region
1b Contact part
1c Bend part
2 Second resin layer
2a Columnar part
3 Electrically conductive pattern
10 to 23 Structure
31 Circuit board
32 Connecting member
40 Wireless communication apparatus
50 to 53 Mold
A Boundary
B Notch
C Protrusion

The invention claimed is:

1. A structure comprising:
a first resin layer which is an injection-molded article;
a second resin layer; and
an electrically conductive pattern provided on a surface of the first resin layer,
the second resin layer being molded, by insert-molding, on the first layer so that the electrically conductive pattern is provided between the first resin layer and the second resin layer, and
the first resin layer having:
a covered region which is covered by the second resin layer and an exposed region which is not covered by the second resin layer;
a contact part which is provided in the exposed region and in which a contact for electrically connecting the electrically conductive pattern to another member is provided; and
a bend part which is provided between (a) a boundary between the covered region and the exposed region and (b) the contact part and which is a part bending on a surface of the first resin layer.

2. The structure as set forth in claim 1, wherein the first resin layer has the bend part in a region in which electrically conductive pattern is provided.

3. The structure as set forth in claim 1, wherein:
the exposed region has a recess which is recessed with respect to the covered region, which is adjacent to the exposed region; and
the contact part is provided in the recess.

4. The structure as set forth in claim 1, wherein the exposed region has a protrusion which protrudes with respect to the covered region, which is adjacent to the exposed region.

5. The structure as set forth in claim 1, wherein the exposed region has a recess which is recessed with respect to the covered region, which is adjacent to the exposed region.

6. A wireless communication apparatus comprising:
a housing including the structure recited in claim 1; and
an antenna including the electrically conductive pattern.

7. A method for producing the structure recited in claim 1, comprising the step of:
placing, in a mold, the first resin layer which is the injection-molded article and on which the electrically conductive pattern is provided, and molding, by insert-molding, the second resin layer on the first resin layer in a state in which the mold and the exposed region are fitted to each other.

8. A structure comprising:
a first resin layer;
a second resin layer; and
an electrically conductive pattern provided on a surface of the first resin layer,
the second resin layer being molded on the first layer so that the electrically conductive pattern is provided between the first resin layer and the second resin layer, and
the first resin layer having:
a covered region which is covered by the second resin layer and an exposed region which is not covered by the second resin layer;
a contact part which is provided in the exposed region and in which a contact for electrically connecting the electrically conductive pattern to another member is provided; and
a bend part which is provided in a region in which the electrically conductive pattern is provided and which is provided between (a) a boundary between the covered region and the exposed region and (b) the contact part and which is a part bending on a surface of the first resin layer.

9. The structure as set forth in claim 8, wherein:
the exposed region has a recess which is recessed with respect to the covered region, which is adjacent to the exposed region; and
the contact part is provided in the recess.

10. The structure as set forth in claim 8, wherein the exposed region has a protrusion which protrudes with respect to the covered region, which is adjacent to the exposed region.

11. The structure as set forth in claim 8, wherein the exposed region has a recess which is recessed with respect to the covered region, which is adjacent to the exposed region.

12. A wireless communication apparatus comprising:
a housing including the structure recited in claim 8; and
an antenna including the electrically conductive pattern.

13. A method for producing the structure recited in claim 8, comprising the step of:
placing, in a mold, the first resin layer on which the electrically conductive pattern is provided, and integrally molding the second resin layer with the first resin layer in a state in which the mold and the exposed region are fitted to each other.

14. A wireless communication apparatus comprising:
a housing including a structure; and
an antenna,
the structure including:
a first resin layer;
a second resin layer; and an electrically conductive pattern provided on a surface of the first resin layer, the second resin layer being molded on the first layer so that the electrically conductive pattern is provided between the first resin layer and the second resin layer, the first resin layer having:
- a covered region which is covered by the second resin layer and an exposed region which is not covered by the second resin layer;
- a contact part which is provided in the exposed region and in which a contact for electrically connecting the electrically conductive pattern to another member is provided; and
- a bend part which is provided between (a) a boundary between the covered region and the exposed region and (b) the contact part and which is a part bending on a surface of the first resin layer, and the antenna including the electrically conductive pattern.

* * * * *